(12) United States Patent
Ide

(10) Patent No.: US 9,887,333 B2
(45) Date of Patent: Feb. 6, 2018

(54) LIGHT EMITTING DEVICE AND ELEMENT MOUNTING BOARD

(71) Applicant: NICHIA CORPORATION, Anan-shi, Tokushima (JP)

(72) Inventor: Yoshiyuki Ide, Anan (JP)

(73) Assignee: Nichia Corporation, Anan-shi (JP)

( * ) Notice: Subject to any disclaimer, the term of this patent is extended or adjusted under 35 U.S.C. 154(b) by 0 days.

(21) Appl. No.: 15/356,999

(22) Filed: Nov. 21, 2016

(65) Prior Publication Data
US 2017/0155023 A1 Jun. 1, 2017

(30) Foreign Application Priority Data

Nov. 27, 2015 (JP) .................................. 2015-232208

(51) Int. Cl.
| | |
|---|---|
| *H01L 33/62* | (2010.01) |
| *H01L 33/48* | (2010.01) |
| *H01L 33/50* | (2010.01) |
| *H01L 33/60* | (2010.01) |

(52) U.S. Cl.
CPC ............ *H01L 33/62* (2013.01); *H01L 33/486* (2013.01); *H01L 33/502* (2013.01); *H01L 33/60* (2013.01)

(58) Field of Classification Search
None
See application file for complete search history.

(56) References Cited

U.S. PATENT DOCUMENTS

| | | | |
|---|---|---|---|
| 2005/0211997 A1* | 9/2005 | Suehiro | H01L 33/20 257/88 |
| 2007/0228105 A1 | 10/2007 | Oshika et al. | |
| 2012/0104452 A1 | 5/2012 | Miyoshi et al. | |
| 2014/0239320 A1 | 8/2014 | Miyoshi et al. | |
| 2015/0153009 A1* | 6/2015 | He | H01L 33/508 362/84 |
| 2015/0263247 A1 | 9/2015 | Wada et al. | |

(Continued)

FOREIGN PATENT DOCUMENTS

| | | |
|---|---|---|
| JP | 2000-277523 A | 10/2000 |
| JP | 2007-294899 A | 11/2007 |

(Continued)

*Primary Examiner* — Eva Yan Montalvo
*Assistant Examiner* — Kevin Quinto
(74) *Attorney, Agent, or Firm* — Global IP Counselors, LLP

(57) ABSTRACT

A light emitting device includes: an element mounting board having a base and conductive patterns disposed on a main surface of the base, and each having one or more element mounting areas and one or more external connection areas; conductive patterns each having first and second conductive layers which is made of a different material from that of the first conductive layer, and disposed in this order starting from the base side; element mounting areas, on which the light emitting elements are mounted, having the first conductive layer that is not covered by the second conductive layer; external connection areas having the first conductive layer in which an outer edge is exposed from the second conductive layer; a light reflecting component integrally covers the element mounting areas and lateral surfaces of the light emitting elements; and a light-transmissive component exposing the external connection areas.

14 Claims, 10 Drawing Sheets

(56) References Cited

U.S. PATENT DOCUMENTS

2015/0270456 A1    9/2015   Miyoshi et al.
2016/0133800 A1    5/2016   Miyoshi et al.

FOREIGN PATENT DOCUMENTS

| | | |
|---|---|---|
| JP | 2012-099544 A | 5/2012 |
| JP | 2012-099545 A | 5/2012 |
| JP | 2012-174808 A | 9/2012 |
| JP | 2013-026416 A | 2/2013 |
| JP | 2015-092622 A | 5/2015 |
| JP | 2015-177120 A | 10/2015 |

* cited by examiner

LIGHT EMITTING DEVICE AND ELEMENT MOUNTING BOARD

CROSS-REFERENCE TO RELATED APPLICATIONS

This application claims priority to Japanese Patent Application No. 2015-232208 filed on Nov. 27, 2015. The entire disclosure of Japanese Patent Application No. 2015-232208 is hereby incorporated herein by reference.

BACKGROUND

1. Technical Field

The present disclosure relates to an element mounting board and a light emitting device.

2. Description of Related Art

In recent years, semiconductor light emitting elements have been utilized not only as light sources for lighting as an alternative to fluorescent lights, but also as light sources having high luminance and good directionality employed in automotive headlights and other such light projectors, in floodlights, and so forth.

A light emitting device that can be used in such applications has been proposed in Japanese Unexamined Patent Application Publication No. 2015-177120, for example. With this light emitting device, a plurality of light emitting elements are arranged on a board equipped with a conductive pattern. The conductive patterns that connect the light emitting elements extend to the outside of an encapsulation component, and is used as an external electrode for connecting to an external power supply.

The conductive pattern used as an external electrode is susceptible to poor connection caused by the application of high voltage over an extended period, depending on the combination of the shape and/or material, etc., of the conductive pattern and the wires or other power supplies that are connected to the conductive pattern.

SUMMARY

The present disclosure is conceived in light of the above characteristic, and it is an object thereof to provide an element mounting board and a light emitting device with which reliable connection can be ensured over an extended period.

(1) A light emitting device of the present disclosure includes: an element mounting board having a base; a first and second conductive patterns that are disposed on a main surface of the base, and each include one or more element mounting areas and one or more external connection areas; one or more light emitting elements that are mounted on the element mounting areas and each include an upper surface serving as the light extraction surface; a light-transmissive component that is disposed on the upper surfaces of the light emitting elements; a light reflecting component that integrally covers the element mounting areas and lateral surfaces of the light emitting elements and the light-transmissive component while exposing the external connection area. Each of the first and second conductive patterns includes a first conductive layer and a second conductive layer that is made of a different material from a material of the first conductive layer and is disposed after the first conductive layer. The element mounting areas include the first conductive layer that is not covered by the second conductive layer, and the external connection areas include the first conductive layer of which an outer edge is exposed from the second conductive layer.

(2) An element mounting board of the present disclosure includes a base and conductive patterns that are disposed on a main surface of the base. Each of the conductive patterns includes a part that is covered by a light reflecting component. The conductive patterns each have one or more element mounting areas that are covered by the light reflecting component, and external connection areas that extends from the element mounting area and is exposed from the light reflecting component. The conductive patterns each include a first conductive layer and a second conductive layer that is made of a different material from a material of the first conductive layer. The first conductive layer and the second conductive layer are disposed in this order starting from the base side. The element mounting areas include the first conductive layer that is not covered by the second conductive layer, and the external connection area include the first conductive layer in which an outer edge is exposed from the second conductive layer.

DETAILED DESCRIPTION

Embodiments of the present invention will be described below with reference to the accompanying drawings. In the following embodiment that embody the technological concept of the present invention are just examples, and unless otherwise specified, the constituent parts discussed in the embodiments are not intended to limit the scope of the present invention. Further, constitutions described in examples and the embodiments can be employed in other examples and embodiments.

The sizes and the arrangement relationships of the components in each of drawings are occasionally shown exaggerated for ease of explanation.

Element Mounting Board

Figure 1:
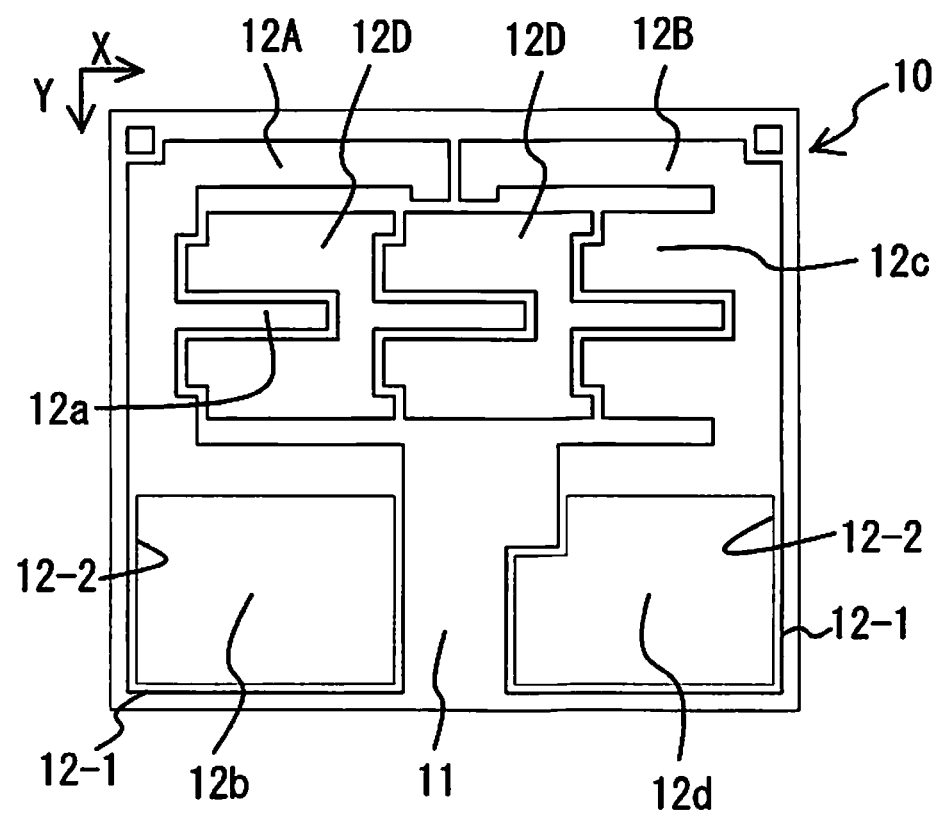
FIG. 1 is a schematic plan views the element mounting board disclosed according to an embodiment.

As shown in FIG. 1, the element mounting board 10 in this embodiment includes a base 11 and a set of conductive patterns 12A and 12B disposed on a main surface of the base 11. The conductive patterns 12A and 12B each include one or more element mounting areas 12a and 12c, and external connection areas 12b and 12d. The conductive patterns 12A and 12B each include a first conductive layer 12-1 and a second conductive layer 12-2 made of a different material from that of the first conductive layer 12-1, in the order starting from the base 11 side. The one or more element mounting areas 12a and 12c each include a first conductive layer 12-1 that is not covered by the second conductive layer 12-2. In other words, the first conductive layer 12-1 is exposed from the second conductive layer 12-2. The external connection areas 12b and 12d each have the first conductive layers 12-1 and the second conductive layer 12-2, and the outer edges of the external connection areas 12b and 12d are provided such that the first conductive layer 12-1 is exposed from the second conductive layer 12-2.

With this configuration, conductive layers made from different materials can be disposed on a set of conductive patterns, namely, first conductive layers on the one or more element mounting areas and second conductive layers on the external connection areas. Thus, the conductive patterns 12A and 12B each can be disposed with materials suitable for bonding the one or more element mounting areas and the external connection areas to their elements or the external power supplies. Consequently, adhesion between the elements and the element mounting board, and adhesion between the external power supplies and the element mounting board can both be stronger and secured.

Base

The base can be selected from boards that are normally used for the mounting of one or more light emitting elements and the like. For instance, the base can be formed of a glass, a glass epoxy, resins such as a thermoplastic resin and a thermosetting resin, ceramics, a paper phenol, a paper epoxy, a glass composite, a low temperature co-fired ceramic (LTCC), a metal component formed with these insulating components. Of these, it is preferable to use a ceramic due to high heat resistance and environmental resistance. Examples of ceramic materials include alumina, aluminum nitride, and mullite, and these ceramic materials may be combined, for example, with a BT resin, a glass epoxy, an epoxy resin, or another such insulating material.

The size and shape of the base can be suitably set according to the design of the light emitting device. For example, the base is preferably a plate-like shape, and flat on the front and back surfaces. Planar shapes may be quadrangular, circular, elliptical, polyhedral, or the like, but a substantially rectangular shape is preferable from the standpoint of ease of formation.

Conductive Patterns

A set of conductive patterns that are connected to the one or more light emitting elements is disposed on a main surface of the base. The conductive patterns constitute a predetermined shape obtained by extending a line on a main surface of the base, and their planar shape can be suitably set according to the design of the light emitting device.

The conductive patterns each include the one or more element mounting areas and external connection areas. The one or more element mounting areas refer to a region in which all or part of the one or more light emitting elements discussed below are mounted, and which are connected to the electrodes of the one or more light emitting elements. The one or more element mounting areas include not only the region where the one or more light emitting elements are mounted, but also the vicinity. The external connection areas refer to a region that extends from the one or more element mounting areas, and are used to ensure electrical connection with the outside. Each of one or more of the element mounting areas may have a surface shape that is different from that of the other conductive pattern in the set, so as to correspond to the electrode shape of the one or more light emitting elements, the layout, etc. Also, the external connection areas may have shapes that are different from each other in order to recognize positive and negative. Thus, depending on the set of patterns, the planar shapes of the one or more element mounting areas and the external connection areas may be the same, but preferably have different shapes.

The terms element mounting area and external connection area refer to regions that are mutually different in order for the above-mentioned functions to be fulfilled, but there is no clear boundary between the two.

The external connection areas, which are substantially quadrangular shapes in a plan view, are preferably disposed at the end of the base. The external connection areas may be disposed (i) extending in the x direction from the one or more element mounting areas to the end of the base, (ii) extending in the x direction from the one or more element mounting areas, bending along the end of the base, and extending to the other end of the base, (iii) extending from the one or more element mounting areas in a direction that is different from the x direction, such as the y direction that is perpendicular to the x direction, or (iv) extending from the one or more element mounting areas in the y direction, bending along the end of the base, and extending to the other end of the base.

With the external connection areas disposed at the end of the base, the power supplies that is used to supply power to the external connection areas, such as wires, can be shorter in connection length, which allows more certain and easier power supply. It is especially preferable for the external connection areas to have shapes that extend along the same sides of the base. This allows electrical power to be supplied to the external connection areas equally, over the same distance, and in the same direction, for both positive and negative.

The conductive patterns are such that the first conductive layers and the second conductive layers, which are made of a different material from that of the first conductive layers, are stacked in this order, starting from the base side. The idea of "different material" here encompasses materials in which some of the elements are the same but others are different in a single layer, and in the case of a stacked structure, this also encompasses those in which some of the layers are the same and others are different, those in which the stack order is different, and so forth.

The one or more element mounting areas of the conductive patterns have first conductive layers that are not covered by the second conductive layers. In other words, the first conductive layers that are exposed from the second conductive layers are disposed on all or part of the one or more element mounting areas.

The external connection areas of the conductive patterns each have first conductive layers and second conductive layers, and the outer edges of the first conductive layers are exposed from the second conductive layers. This exposure of the outer edges of the first conductive layers allows the outer edge shapes of the first conductive layers exposed at the external connection areas to serve as a recognition pattern in the mounting of the light emitting device on a secondary mounting board in a light emitting device that makes use of the element mounting board pertaining to this embodiment. In the case that the outer edges of the first conductive layers of the external connection areas are covered by the second conductive layers, the outer edge patterns of the second conductive layers are to be used as recognition patterns during secondary mounting, but in the case where the second conductive layers are used as recognition patterns during secondary mounting, there is a risk of reduction in accuracy of the secondary mounting due to pattern misalignment caused by dimensional tolerance of the second conductive layers. However, the positional accuracy of the light emitting surface during secondary mounting can be enhanced by using the first conductive layers on which the one or more light emitting elements are mounted as a recognition pattern during secondary mounting.

The outer edges of the first conductive layers exposed from the second conductive layers in the external connection areas are preferably disposed all the way around the outer edges of the external connection areas, but part of the outer edges of the external connection areas may be covered by the second conductive layers. The width of the first conductive layers exposed from the second conductive layer are preferably consistent, but there may be a portion partially wider or narrower. The width of the outer edges can be suitably set according to the size of the light emitting device. For example, it can be about 1/100 to 1/10 the width of each of the external connection areas. More specifically, it can be about 20 to 150 μm, for example. The planar shapes of the second conductive layers in the external connection areas may be the same as or different from the shape of the set of conductive patterns.

The second conductive layers in the external connection areas may have a slit or a groove. This slit or groove may be provided as a hole or a recess on the inside of the outer edge of the second conductive layers in plan view, but the second conductive layers are preferably divided into a plurality of regions using slits or grooves as boundaries. The slit or groove is preferably formed substantially parallel to the boundary between the external connection areas and the one or more element mounting areas, for example. More specifically, it is preferably disposed parallel to the edge of the light reflecting component discussed below. This layout of the slit or groove can reduce the wet spreading of the resin component during formation of the light reflecting component, as discussed below. That is, the slits or grooves in the second conductive layers at the external connection areas can act as dams for the resin component.

The first conductive layers and second conductive layers can be formed from a single-layer or multilayer structure of a metal such as Al, Au, Pt, Ti, Cu, Pd, Rh, Ni, W, Mo, Cr, Ag or an alloy thereof. Also, ITO or another such conductive material other than a metal may be used.

The one or more element mounting areas have a first conductive layers that are not covered by the second conductive layers, and the one or more light emitting elements are mounted on one of the first conductive layer. The outermost surfaces of the first conductive layers are preferably layers that contain gold. The electrodes of the one or more light emitting elements usually make use of gold, using layers containing gold as the outermost surfaces of the first conductive layers improve the adhesion reliability of the light emitting elements. Since an adhesion between two components both made of gold affords good reliability, even if high voltage is applied, the light emitting device less likely to deteriorate, and a highly reliable adhesion can be maintained over an extended period. The first conductive layers may be a stacked layer such as AlSiCu/Ti/Pt/Au, Ti/Rh/Au, W/Pt/Au, Rh/Pt/Au, Ni/Pt/Au, Ti/Rh/Au in this order starting from the base, or single-layer of Au. The total thickness of each of the first conductive layers, taking into account the separation of the first conductive layers caused by impact during element mounting, is preferably at least 1.0 μm, and more preferably at least 3.0 μm. Particularly when the outermost surface is gold, the thickness of the gold is preferably at least 1.0 μm. Also, the total thickness of each of the first conductive layers is preferably no more than about 10.0 μm. This range of thickness allows the desired layer to be formed within a suitable length of time, thus saves material cost and film formation time.

The external connection areas have first conductive layers and second conductive layers, and are disposed in this order starting from the base side, and the outer edges of the first conductive layers are exposed from the second conductive layers. A power supply from the outside is connected to the second conductive layers. The outermost surfaces of the second conductive layers are preferably layers that contain copper or aluminum, and more preferably are layers that contain aluminum. Using layers that contain aluminum or the like as the outermost surfaces of the second conductive layers allows an aluminum wire or the like to be used for the component that supplies power to the external connection areas. Aluminum is less expensive than gold, and can be easily adhered with ultrasonic waves alone, without requiring heat treatment, thus, is preferably used for power supply material.

From the standpoint of connection reliability, the power supply connected to the external connection areas preferably makes use of a metal material that is the same as on the outermost layer of the external connection areas. With a connection between different metal materials, an alloy layer is formed through the diffusion of the different metals into each other, but depending on the combination of metal materials, there is a risk that the alloy layer may become brittle as the diffusion proceeds, leading to a poor connection. However, if the same metal material is used for both the power supply and the outermost surfaces of the second conductive layers, this will particularly less likely to alloy metals at the connection region attributable to the heat generating by the one or more light emitting elements, and furthermore will avoid deterioration, ensuring a more secure connection over the long term. More specifically, this can be formed by a single-layer film of aluminum or copper or a multi-layer film formed by a stack of Ti/Al, Ti/Cu, Ni/Al, Ti/Cu, or the like are stacked in this order starting from the first conductive layer side. The total thickness of each of the second conductive layers is preferably at least 1.0 μm, and more preferably at least 3.0 μm. Particularly when an aluminum layer is used for the outermost surface, since aluminum is a soft metal, taking into account the separation that can result from impact during the connection of the power supply, the thickness of the aluminum layer is preferably at least 2.0 μm. Taking into account the suitable film formation time, material cost, and so forth, the total thickness of each of the second conductive layers is preferably no more than about 10.0 μm.

In addition to the above-mentioned set of conductive patterns, the conductive pattern may also has a third conductive pattern for electrically connecting to the light emitting elements, according to the number of light emitting elements to be mounted. For instance, one or more patterns corresponding to the one or more element mounting areas of the set of conductive patterns may be arranged between the one or more element mounting areas of the set of conductive patterns. The shape and layout of this third conductive pattern may be such that a plurality of light emitting elements are independently driven, or the elements are driven in series, or in parallel, or a combination of these, depending on the shape of the set of conductive patterns, their power supply control, and so forth.

The conductive patterns may be disposed at least on the front surface of the base, and may extend to the rear surface of the base via a through-hole in the base, or via the end surfaces of the base.

Method for Forming Set of Conductive Patterns

The series of conductive patterns can be formed by a method known in this field. Examples include the following methods (i) to (iii), and methods that combine parts of these methods.

(i) A first conductive film that will constitute first conductive layers is formed on a main surface, and the first conductive film is worked into a specific shape by etching using a first conductive layer mask, which forms a first conductive layer. Then, a second conductive film that will constitute second conductive layers is formed on the base on which the first conductive layers are formed, and the second conductive film is worked into a specific shape by etching using a second conductive layer mask, which forms second conductive layers.

(ii) First conductive layers and second conductive layers are formed in this order on a main surface of the base, and a first conductive layer mask and a second conductive layer mask are used to etch the second conductive layers and first conductive layers in this order into a specific shape.

(iii) A first conductive film is formed on a main surface of the base using a first conductive layer mask that is open in the shapes of the first conductive layers, and the first conductive film on the first conductive layer mask is removed by lift-off to form first conductive layers in specific shapes. Then, a second conductive layer mask that is open in the shapes of the second conductive layers is formed on the base on which the first conductive layer was formed, a second conductive film is formed over this, and the second conductive film on the second conductive layer mask is removed by lift-off to form second conductive layers in specific shapes.

The first conductive film and the second conductive film can be formed by vapor deposition, sputtering, CVD, ALD, or another known method. The masks can be formed by photolithography, printing, or the like.

Light Emitting Device

The light emitting device has the above-mentioned element mounting board, one or more light emitting elements that are mounted on one or more element mounting areas of the element mounting board and whose upper surfaces serve as the light extraction surfaces, a light-transmissive component that is disposed on the upper surfaces of the one or more light emitting elements, and a light reflecting component that integrally covers the lateral surfaces of the one or more light emitting elements and the light-transmissive component and the element mounting areas of the element mounting board and that exposes the external connection areas of the element mounting board.

Light Emitting Element

For the one or more light emitting elements, Light emitting diodes are usually used.

The composition, emission color and wavelength, size, number, and so forth of the light emitting element can be suitably selected as dictated by the intended application. Examples of semiconductor materials include ZnSe, nitride-based semiconductor ($In_xAl_yGa_{1-x-y}N$, $0 \le X$, $0 \le Y$, $X+Y \le 1$), GaP for a blue or green light emitting element, GaAlAs, AlInGaP for a red light emitting element.

The light emitting element is usually formed by stacking a semiconductor layer on a growth substrate (such as a sapphire substrate). The substrate may be textured on the surface that is bonded with the semiconductor layer. This allows the critical angle at which light emitted from the semiconductor layer hits the substrate to be intentionally changed, affording easier extraction of the light to the outside of the substrate.

The growth substrate of the light emitting element may be removed after the stack of the semiconductor layer. This removal can be accomplished by polishing, LLO (laser lift-off), or the like. In the case that the growth substrate is removed, a support substrate may be provided to the semiconductor layer for use in mounting.

The light emitting element preferably has a pair of electrodes (positive and negative) on the same surface side. This allows the light emitting element to be flip-chip mounted to the mounting substrate. In this case, the surface that is opposite the surface on which the pair of electrodes is formed will serve as the main light extraction surface. Flip-chip mounting makes use of solder or other such paste-like conductive bonding component, a thin-film bonding component, or a bump-form bonding component to electrically connect the conductive patterns on the base to the light emitting element.

Alternatively, in the case of employing face-up mounting, the surface on which the pair of electrodes is formed may serve as the main light extraction surface.

The light emitting element preferably has a pair of electrodes (i.e., positive and negative) on the same surface side, but may instead has the positive and negative electrodes on different sides. In the case of a light emitting element having an opposing electrode structure in which the positive and negative electrodes is provided on opposite surfaces, the lower surface electrode is fixed to the conductive pattern on the base with a conductive component, and the upper surface electrode is connected to the base with a conductive wire or the like.

In any case, the upper surface is opposite to the surface facing the element mounting board, and the upper surface serves as a main light extraction surface.

The positive and negative electrodes included in the light emitting element preferably have an uppermost surface made of gold. Gold is chemically stable, and ensures good reliability in electrical connection over an extended period. Also, as discussed above, in the case that the outermost surfaces of the first conductive layers are layers that contain gold, a connection with better reliability can be achieved in the case that the material is the same as that of the first conductive layers, and particularly a connection between a gold and a gold.

Only one light emitting element may be used per light emitting device, or two or more thereof may be included. When a single light emitting device includes two or more light emitting elements, these elements are preferably arranged in some order. The light emitting elements may, for example, be disposed in a single row, or may be disposed in an array or in a random arrangement. Then number and planar shape of the light emitting elements can be suitably set according to the characteristics, size, and so forth of the light emitting device to be obtained.

The arranged light emitting elements are preferably close to each other, and when luminance distribution and the like in automotive applications and at the emission surface of the light emitting device are taken into account, the distance between the light emitting elements is preferably less than the size of the light emitting elements themselves (such as their length of one side). For example, this distance is preferably no more than about 30% of the size of the light emitting elements themselves, and more preferably no more than 20%. Thus disposing the light emitting elements close together affords a light emitting device that is a planar light source with little emission unevenness.

The mounting of the light emitting elements on the element mounting board is usually carried out via a bonding component. Examples of the bonding component here include solders such as those based on tin-bismuth, tin-copper, tin-silver, gold-tin, or the like; eutectic alloys mainly containing gold and tin, gold and silicon, gold and germanium, and other such eutectic alloys; silver, gold, palladium, and other such conductive pastes and bumps; ACP, ACF, and other such anisotropic conductive materials; low-melting point metal brazes; conductive adhesives that are a combination of these; and conductive composite adhesives. It is especially good for the light emitting elements to be mounted on the conductive patterns with a bonding component that contains gold, and more preferably, the electrodes of the light emitting elements are each bonded to the conductive patterns with a bonding component that contains gold. In the case that the outermost surfaces of the first conductive layers are a layer that contains gold, connection is even more stably ensured over an extended period by using a bonding component that contains gold.

Light-Transmissive Component

The light-transmissive component is disposed on the upper surface of the one or more light emitting elements, that is, the main light extraction surface. The light-transmissive component transmits light emitted from the one or more light emitting elements, and allows this light to be emitted to the outside. For example, this is preferably a component that transmits at least 60% of the light emitted from the one or more light emitting elements.

The light-transmissive component preferably covers the entire upper surfaces of the one or more light emitting elements in order for the light emitted from the one or more light emitting elements to be extracted efficiently. However, the more the light-transmissive component is larger than the one or more light emitting elements, the less the luminance of the light extracted from it is, so the planar shape of the light-transmissive component is at least the same size as an area of the upper surfaces of the one or more light emitting elements, but is preferably as close to the same size as the one or more light emitting elements as possible. This allows the light emitting device to emit light with higher luminance as well as is further downsized.

The light-transmissive component may cover each of a plurality of light emitting elements individually, or it may cover some or all of them integrally. The outer lateral surfaces of the light-transmissive component are preferably covered by the light reflecting component discussed below.

The thickness of the light-transmissive component can be about 50 μm to 300 μm.

In the case that a single light emitting device has a plurality of light-transmissive components, an upper surfaces of these light-transmissive components are preferably flush or substantially flush. This more effectively reduces interference between the light emitted from the lateral surfaces of the light-transmissive components. Regardless of their number, the light-transmissive components may have any of various shapes, such as a convex and concave surface, a curved surface, or a lens shape. The lower surface of the light-transmissive component is preferably parallel to the light extraction surfaces of the one or more light emitting elements.

Examples of the material that makes up the light-transmissive component include for example: a resin, glass, or inorganic substance; single crystal phosphor, polycrystalline phosphor, or a cut piece of ingot of sintered body, for example, sintered phosphor particles; a sintered body of a phosphor mixed with a resin, glass, or inorganic substance, and the like. The more transparent is the material, the better the light is reflected at the interface with the light reflecting component, thus making it possible to increase the luminance.

When a phosphor is used for the light-transmissive component, examples of a phosphor that is combined with a blue light emitting element to generate white light include YAG (yttrium aluminum garnet) phosphors and BOS (barium orthosilicate) phosphors. When a phosphor such as this is contained in the light-transmissive component, the concentration of the phosphor is preferably about 5 to about 50%.

The light-transmissive component is bonded so as to cover the upper surfaces of the one or more light emitting elements, that is, the light extraction surfaces.

The light-transmissive component can be adhered, for example, by compressing, sintering, bonding with a known adhesive agent such as an epoxy or silicone, bonding with an organic adhesive agent with a high refractive index, bonding with low-melting point glass, and so forth.

The light-transmissive component is usually disposed on the upper surfaces of the one or more light emitting elements, but depending on the format, it may cover parts of the external connection areas and/or the element mounting areas of the conductive pattern. That is, the light-transmissive component may cover part of the first conductive layers and/or part of the second conductive layers.

Light Reflecting Component

The light reflecting component integrally covers the lateral surfaces of the one or more light emitting elements. This covering may be via a separate layer between the light reflecting component and the lateral surfaces of the one or more light emitting elements.

An example of a separate layer that is disposed between the light reflecting component and the lateral surfaces of the one or more light emitting elements is a filling component such as an underfill or an adhesive agent discussed below. An adhesive agent is used when the light-transmissive component covers the upper surfaces of the one or more light emitting elements. In the case where an adhesive agent is interposed between the semiconductor layer and the light reflecting component, the adhesive agent is preferably disposed so as not to protrude from the region directly under the light-transmissive component. Also, in the case where a filling component is interposed, it is preferably a substance with good light reflectivity. In the case where the filling component has high light reflectivity, the interposed thickness can be suitably set.

In the case where the upper surfaces of the light emitting elements serve as the light extraction surfaces of the light emitting device, the light reflecting component disposed between the light emitting elements is preferably flush or substantially flush with the upper surfaces of the light emitting elements. In this Specification, the term "substantially flush" means that a height differential of about ±10%, and preferably about ±5%, of the thickness of the light reflecting component is permitted.

Alternatively, in the case where the light-transmissive component is disposed on the upper surfaces of the light emitting elements, the upper surface of the light reflecting component is preferably flush or substantially flush with the upper surface of the light-transmissive component.

Also, in the case where a plurality of light-transmissive components are each disposed on the upper surfaces of a plurality of light emitting elements, the light reflecting components disposed between the light-transmissive components are preferably flush or substantially flush with the upper surfaces of the light-transmissive components.

The shape of the light reflecting component can be suitably set according to the number of light emitting elements, the layout of the light emitting elements, and so on. It is especially preferable to be rectangular or a shape similar to this in the planar shape. In plan view, part of the outer edge of the light reflecting component preferably coincides with the outer edge of the element mounting board. The outer edge of the light reflecting component on the external connection area side of the conductive pattern on the element mounting board is preferably parallel or substantially parallel to the outer edges of the element mounting board, the outer edges of the external connection areas (such as the outer edges of the end extending in the x direction or the y direction), etc. The term "substantially parallel" here means that a variance of about ±10°, and preferably ±5°, from parallel is permitted.

The outer edge of this light reflecting component may be disposed either on the element mounting area side or the external connection area side of the conductive pattern. In other words, the outer edges of the light reflecting component may be disposed on either the first conductive layers or the second conductive layers, and in the case that the second conductive layers have slits or grooves as discussed above, this outer edge may be disposed on all or part of that slits or grooves. In particular, in the case that the second conductive layers are divided into a plurality of regions by the slits or grooves, the outer edges of the light reflecting component are preferably disposed away from one of the sections of the second conductive layers, and over the other part of the second conductive layers. This makes use of the slits or grooves to effectively reduce bleeding of the light reflecting component by the resin component, etc. Also, the outer edge of the light reflecting component may be disposed between the element mounting areas and the external connection areas.

In an embodiment, the light reflecting component integrally covers the element mounting areas, the lateral surfaces of the one or more light emitting element, and the light-transmissive component. All or part of the external connection area is exposed from the light reflecting component.

As discussed above, in the case that the second conductive layers are divided into two or more sections by slits or grooves in the external connection area, one section of the second conductive layer divided by the slit or groove is preferably away from the light reflecting component. The other part of the second conductive layer divided by the slits or grooves may be in contact with the light reflecting component, or part or all of them may be covered by the light reflecting component.

For example, in the case where the light reflecting component is made of a resin material, there is a possibility that a resin component is bled from the resin material, and set-spread on the conductive pattern. However, this wet-spreading may be reduce by using the slit or groove dividing the second conductive layer as a boundary at the external connection area. As a result, poor adhesion between the external connection area and the power supply and other such problems caused by wet spreading of the resin component during formation of the light reflecting component will be less likely to occur.

The light reflecting component is formed from a material that can reflect the light emitted from the one or more light emitting elements. Consequently, the light emitted from the one or more light emitting elements is reflected inside the one or more light emitting elements at interface between the one or more light emitting element and the light reflecting component. As a result, light propagates within the light emitting element, and is ultimately outputted to outside of the light emitting device through the upper surface of the light emitting element and the upper surface of the light-transmissive component.

The light reflecting component can be formed from a light reflecting substance and a resin, hybrid resin, or the like including one or more of a silicone resin, a modified silicone resin, an epoxy resin, a modified epoxy resin, and an acrylic resin. Examples of light reflecting substances include titanium oxide, silicon oxide, zirconium oxide, potassium titanate, alumina, aluminum nitride, boron nitride, and mullite.

The contained amount of the light reflecting substance and so forth can affect the amount of light reflected and transmitted by the light reflecting component, etc., so it can be suitably adjusted according to the characteristics of the light emitting device to be obtained. For example, the light reflecting substance is preferably contained in an amount of at least 30 wt %.

The light reflecting component may be made from a material that disperses heat in addition to reflecting light. The thermal conductivity of the light reflecting component is preferably at least 0.2 W/m·K, and more preferably at least 1 W/m·K. Heat dissipation can be improved by setting the thermal conductivity higher. Examples of a material such as this include boron nitride and aluminum nitride with high thermal conductivity.

For example, as discussed below, in the case that the light-transmissive component contains a phosphor, the phosphor may undergo self-heating attributable to Stokes loss, and this heat can lower the light conversion efficiency. On the other hand, in the case that the light reflecting component has a high thermal conductivity, heat from the phosphor in the light-transmissive component can be efficiently dissipated.

The light reflecting component can be formed, for example, by injection molding, potting, resin printing, transfer molding, compression molding, and so forth.

Other Components

As discussed above, when the one or more light emitting elements are bonded on a mounting board, a filling component that reflects light may be disposed between the mounting board and the one or more light emitting elements. With this structure, the light emitted in the downward direction of the one or more light emitting elements can be reflected, and thus the light flux is increased. Also, stress caused by a difference in the coefficient of thermal expansion between the one or more light emitting elements and the base can be absorbed, or heat dissipation can be enhanced. This light reflecting component may be disposed integrally and directly below the light emitting element from the lateral surfaces of the one or more light emitting elements, or a component directly below the one or more light emitting elements may be partially separated from the component on the lateral surfaces.

The filling component disposed directly under the one or more light emitting elements can be formed by selecting from the material forming the light reflecting component that covers the lateral surfaces of the one or more light emitting elements. The filling component may be formed from a different material from that of the light reflecting component, or they may both be formed from the same material.

A Zener diode or other such protective element may be mounted in the light emitting device of the present disclosure. For example, by embedding a protective element in the light reflecting component, a decrease in light extraction can be reduced due to absorption or blocking of light from the one or more light emitting elements.

Embodiment 1: Element Mounting Board

As shown in FIG. 1, the element mounting board 10 in this Embodiment 1 has a base 11 and a set of conductive patterns 12A and 12B disposed on a main surface of the base 11. The conductive patterns 12A and 12B respectively have element mounting areas 12a and 12c and external connection areas 12b and 12d.

The conductive patterns 12A and 12B are produced by laminating a first conductive layer 12-1 and a second conductive layer 12-2, which is made from a different material from that of the first conductive layer 12-1, in this order starting from the base 11 side.

The element mounting areas 12a and 12c have the first conductive layer 12-1 that is not covered by the second conductive layer 12-2, and the external connection areas 12b and 12d are such that the outer edges of the first conductive layer 12-1 are exposed from the second conductive layer 12-2.

In the first conductive layer, nickel-chrome alloy film with a thickness of 0.2 μm and a single-layer film of gold with a thickness of 2.5 μm are formed in this order starting from the base side, for example.

In the second conductive layer, a single-layer film of titanium with a thickness of 0.1 μm and a single-layer film of aluminum with a thickness of 4.0 μm are formed in this order starting from the first conductive layer side, for example.

The base 11 is formed from a sheet of aluminum nitride that is substantially rectangular in plan view, measuring 4.0 mm×3.5 mm in size and 0.4 mm thick.

In this embodiment, a titanium layer is provided as underlayers of the second conductive layers 12-2 between the gold layer as the outermost surfaces of the first conductive layers 12-1 and the aluminum layer as the outermost surfaces of the second conductive layers 12-2. Since gold and aluminum are materials that diffuse readily into each other, the titanium layer is provided to suppress interdiffusion between the gold and aluminum. Furthermore, since titanium has good adhesion, providing a titanium layer between the gold layer and the aluminum layer allows the first conductive layers to adhere more securely to the second conductive layers.

The element mounting board 10 shown in FIG. 1 is used for mounting three light emitting elements, and one conductive pattern 12A has a protruding region where part of the light emitting elements is mounted in the element mounting area 12a, according to the electrode shape of the light emitting elements. The other conductive pattern 12B has a recessed region corresponding to the protruding region, in the element mounting area 12c, in plan view.

The element mounting board 10 also has two third conductive patterns 12D, which have on the conductive pattern 12A side a recessed region, in plan view, corresponding to the protruding region of the conductive pattern 12A, and have on the conductive pattern 12B side a protruding region corresponding to the recessed region of the conductive pattern 12B. A part of the light emitting elements is also disposed on these third conductive patterns 12D. This allows the three light emitting elements to be connected in series.

The external connection areas 12b and 12d extend from the element mounting area 12a in the Y direction, which is perpendicular to the X direction in which the element mounting area 12a is arranged, and are disposed opposite the same side of the base 11. Thus disposing the external connection areas 12b and 12d opposite the same side allows the external connections to be equally reliable for both.

In the external connection areas 12b and 12d, the outer edge of the first conductive layer 12-1 is exposed from the second conductive layer 12-2. The exposed width is 0.5 mm, for example. The exposed width of the first conductive layer 12-1 may be enough so long as recognizable by a mounting device or an inspection device, and, for example, at least 0.01 mm is preferable.

Thus, the conductive pattern is constituted by a plurality of the first conductive layers and a plurality of the second conductive layers, and the element mounting areas are formed by the first conductive layers exposed from the second conductive layers, and this connects the light emitting elements on the first conductive layers. With the external connection areas, because the outer edges of the first conductive layers are exposed from the second conductive layers, the edge of the first conductive layer can serve as a recognition pattern in mounting the light emitting device on a secondary mounting substrate, which allows the light emitting device to be mounted on the secondary mounting substrate more accurately. In particular, by forming the outermost surfaces of the second conductive layers from layers containing copper or aluminum, electrical power can be supplied to the light emitting device with a wire or the like made of copper or aluminum, which are less expensive than gold. Also, the alloying of metals at the connection site and degradation caused by the heat generated by the light emitting elements can be avoided even when such materials are used, and more reliable connection can be ensured over the long term.

Also, because the external connection areas have a shape that extends toward the same side of the base, electrical power can be supplied equally to the light emitting device from the same direction and over the same distance for both positive and negative.

Embodiment 2: Element Mounting Board

Figure 2:
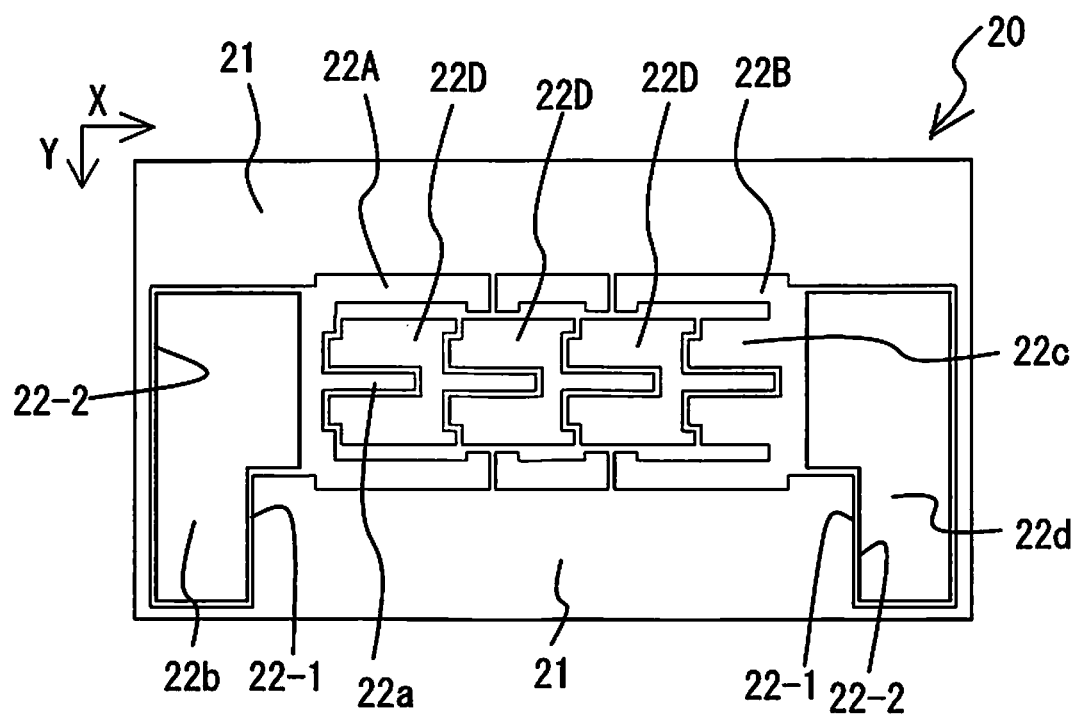
FIG. 2 is a schematic plan views of the element mounting board according to another embodiment.

As shown in FIG. 2, the element mounting board 20 in Embodiment 2 has a base 21 and a set of conductive patterns 22A and 22B disposed on a main surface of the base 21. The conductive patterns 22A and 22B respectively have element mounting areas 22a and 22c and external connection areas 22b and 22d.

The conductive patterns 22A and 22B are configured substantially the same as in the element mounting board 10 in Embodiment 1, except that the external connection areas 22b and 22d extend from the element mounting areas 22a in the same direction X in which the element mounting areas 22a and 22c are arranged, and are disposed facing different sides of the base 21, and that a third conductive pattern 22D is configured for the mounting of additional light emitting element (four in total).

With the element mounting board 20 in Embodiment 2, just as with the element mounting board 10 in Embodiment 1, the edges of the first conductive layers can serve as a recognition pattern in the mounting of the light emitting device on a secondary mounting board, which allows the light emitting device to be mounted on the secondary mounting substrate more accurately.

Embodiment 3: Element Mounting Board

Figure 3:
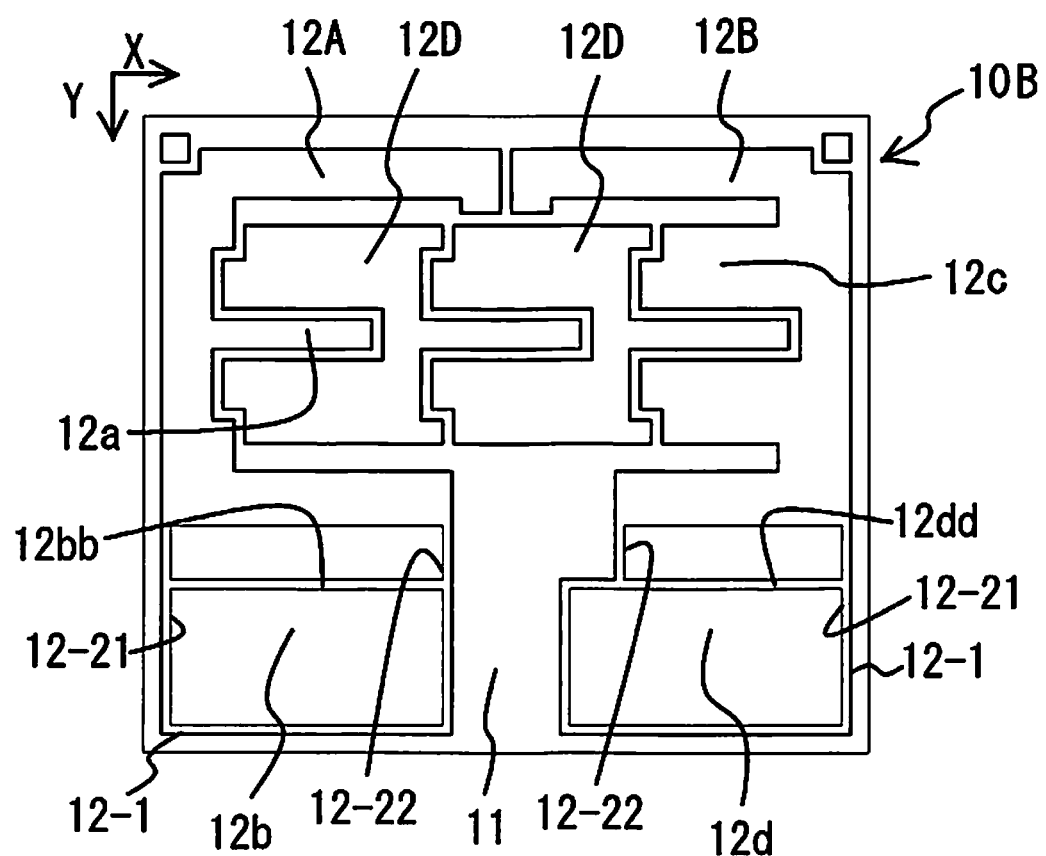
FIG. 3 is a schematic plan views of the element mounting board according to still another embodiment.

As shown in FIG. 3, the element mounting board 10B in Embodiment 3 is configured the same as the element mounting board 10 in Embodiment 1 except that in the external connection areas 12b and 12d, the second conductive layers are divided by slits 12bb and 12dd into second conductive layers 12-21 and 12-22, and the first conductive layer 12-1 is exposed in a width of 0.5 mm between the two second conductive layers 12-21 and 12-22.

The element mounting board 10B in Embodiment 3 is the same as the element mounting board 10 in Embodiment 1 in that the edge of the first conductive layer can serve as a recognition pattern in the mounting of the light emitting device on a secondary mounting board, which allows the light emitting device to be mounted on the secondary mounting substrate more accurately.

Also, the use of these slits effectively reduces the wet spreading of the resin component, etc., during the formation of the light reflecting component discussed below.

Embodiment 4: Light Emitting Device

As shown in FIGS. 4 to 7, the light emitting device 30 in Embodiment 4 has the element mounting board 10, three light emitting elements 31 mounted on the element mounting areas 12a and 12c. Upper surfaces 31a of the light emitting device 30 serve as light extraction surfaces, and a light reflecting component 33 that integrally covers the lateral surfaces of the light emitting elements 31 and a light-transmissive component 32 disposed on the upper surfaces of the light emitting elements 31 and that exposes the external connection areas 12b and 12d. The element mounting board 10 is configured the same as the element mounting board in Embodiment 1.

Figure 5A:
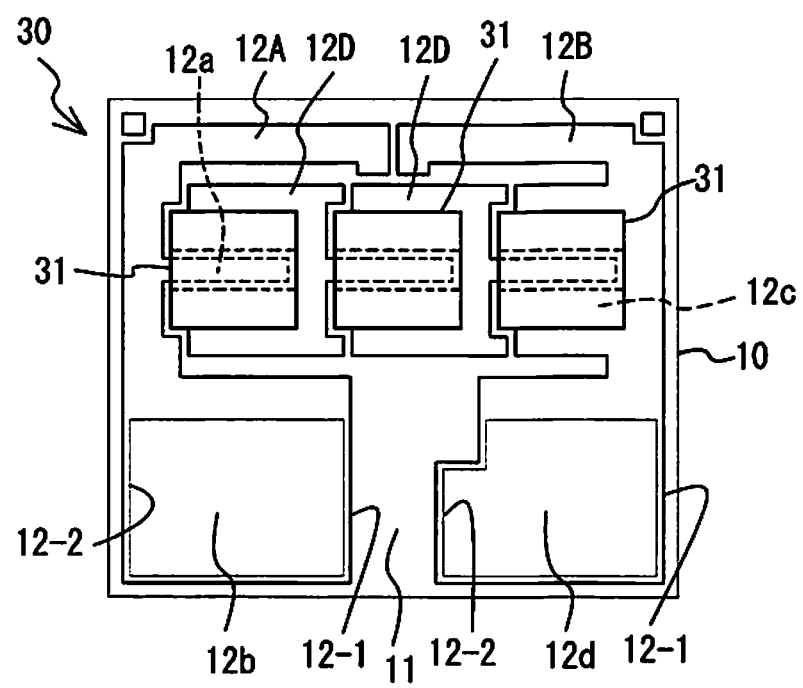
FIG. 5A is a schematic plan view showing the mounting example of one or more light emitting element in FIG. 4.
Figure 8:
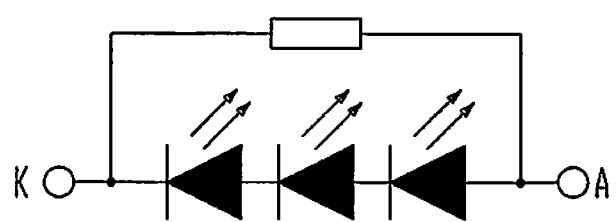
FIG. 8 is a circuit diagram of FIG. 4.

As shown in FIG. 5A, the three light emitting elements 31 are mounted by flip-chip mounting, via bumps composed of gold, on the conductive patterns 12A and 12B and the third conductive pattern 12D of the element mounting board 10. Consequently, as shown in FIG. 8, a light emitting device is configured in which the three light emitting elements 31 are connected in series.

Figure 6:
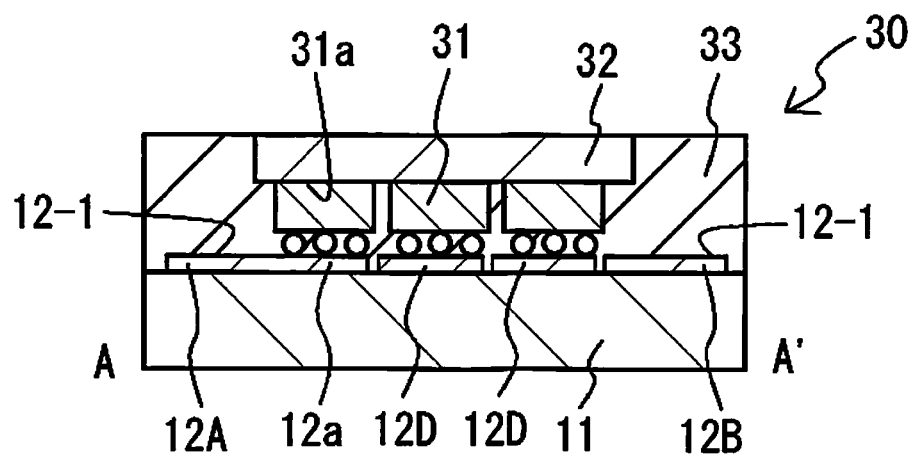
FIG. 6 is a cross section taken along the A-A' line in FIG. 4.

As shown in FIG. 6, a single light-transmissive component 32 is disposed on the three light emitting elements 31. The light-transmissive component 32 is a plate-like component (containing 5 to 15 wt % of YAG phosphor) formed by mixing YAG and alumina and by sintering the mixture, and is bonded to the upper surfaces 31a of the light emitting elements 31 by thermosetting with an adhesive agent containing a silicone resin.

Figure 5B:
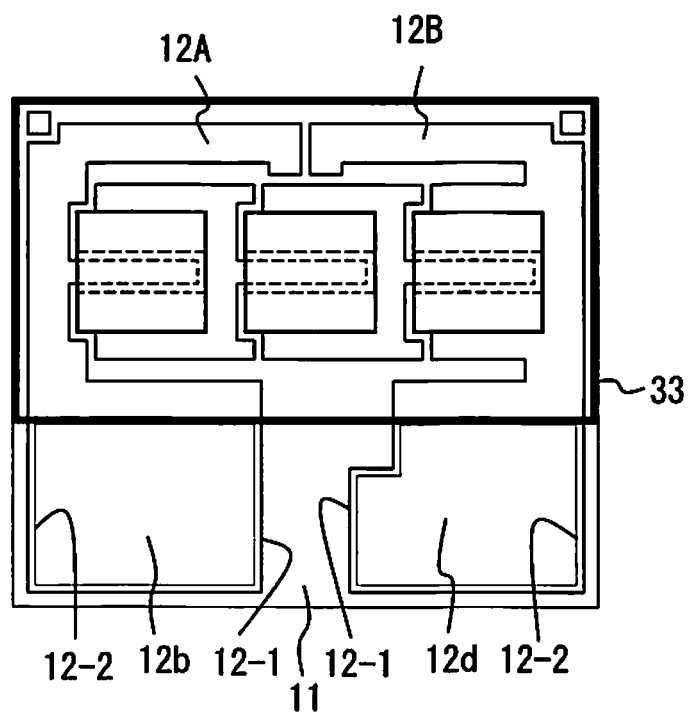
FIG. 5B is a schematic plan view of the relation between second conductive layers and the outer edges of a light reflecting component in FIG. 4.
Figure 7:
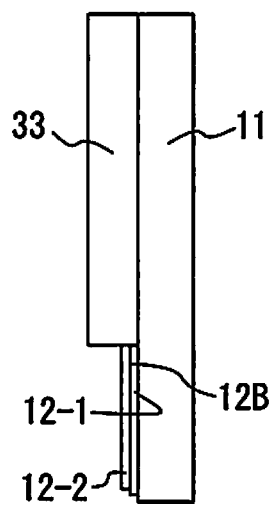
FIG. 7 is a side view as seen from the B direction in FIG. 4.

As shown in FIGS. 5B, 6, and 7, all of the lateral surfaces of the light emitting elements 31 and all of the lateral surfaces of the light-transmissive component 32 are covered by the light reflecting component 33. The light reflecting component 33 is a filling component that integrally fills the space between the light emitting elements 31 and the element mounting board 10. The upper surface of the light reflecting component 33 is substantially flush with the upper surface of the light-transmissive component 32. This reduces the leakage of light toward the lateral surfaces of the light-transmissive component 32, and affords a light emitting device with little emission color non-uniformity.

In FIG. 5B, a part of the outer edge of the light reflecting component 33 is disposed substantially coinciding with part of the outer edges of the second conductive layer 12-2 in the external connection areas 12b and 12d. That is, part of the outer edges of the second conductive layer 12-2 functions as a dam to the light reflecting component 33.

Figure 5C:
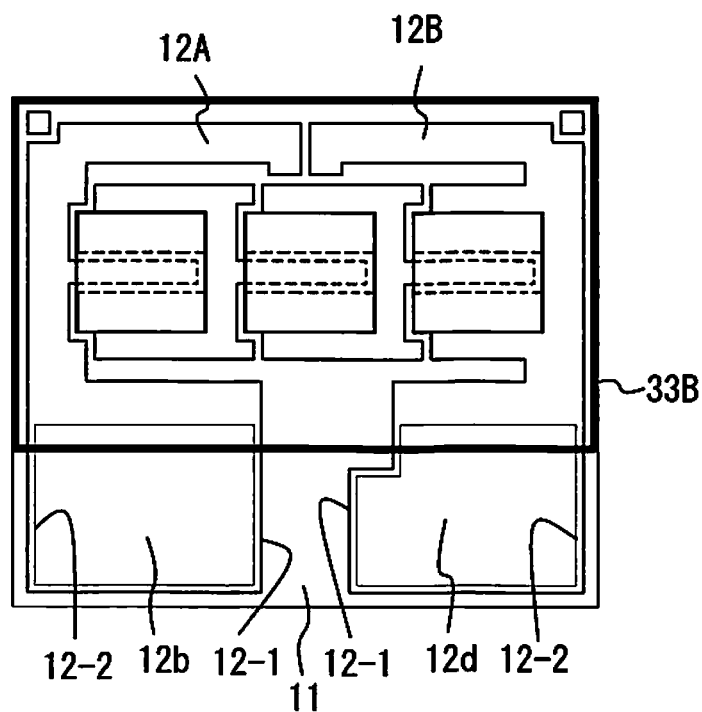
FIG. 5C is a schematic plan view of another relation between the second conductive layers and the outer edges of the light reflecting component in FIG. 4.

As shown in FIG. 5C, the outer edges of the light reflecting component 33 may be disposed over the second conductive layer 12-2.

The light reflecting component 33 may also be disposed away from the outer edges of the second conductive layer 12-2 at the external connection area. The position of the outer edge of the light reflecting component 33 can be suitably altered depending on the metal materials constituting the first conductive layer and second conductive layer, differences in wettability of the resin material used in forming the light reflecting component, and so forth.

The light reflecting component 33 contains 30 wt % of titanium oxide in a silicon resin, and its thermal conductivity is about 0.2 W/m·K.

Figure 4:
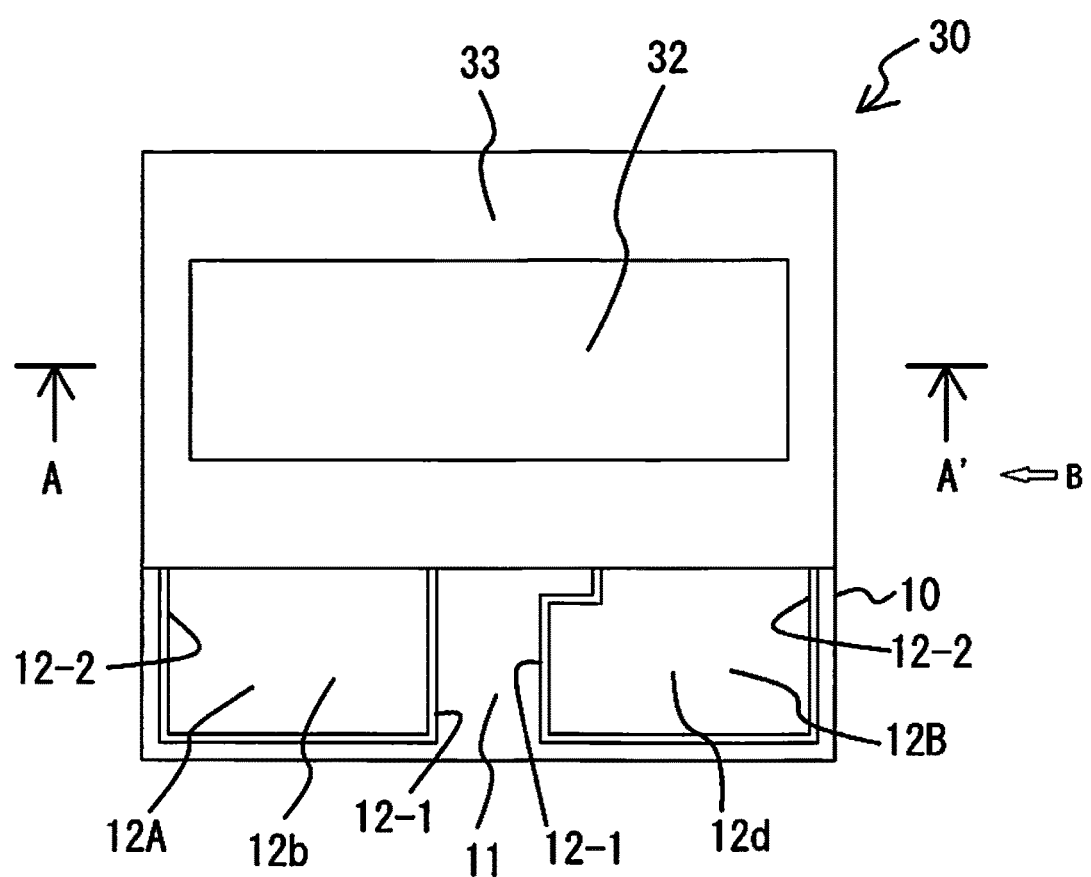
FIG. 4 is a schematic plan view of the light emitting device according to an embodiment.

As shown in FIG. 4, the light emitting device 30 in Embodiment 4 has mutually different surface shapes for the external connection areas 12b and 12d, making it easier to distinguish between the positive and negative electrodes of the light emitting device 30. With this light emitting device 30, the boundary between the light reflecting component 33 and the external connection area 12d of one conductive pattern 12B is narrower than the boundary between the light reflecting component 33 and the external connection area 12b of the other conductive pattern 12A. Thus providing a narrower part or a wider part to one of the external connection areas makes it easy to recognize the positions of the positive and negative electrodes of the light emitting device. Furthermore, since a ceramic material adheres to a resin material better than a conductive pattern composed of a metal material, disposing the narrower part on the light reflecting component side increases the contact surface area between the light reflecting component and the base, which improves adhesion between the light reflecting component and the base.

Embodiment 5: Light Emitting Device

Figure 9:
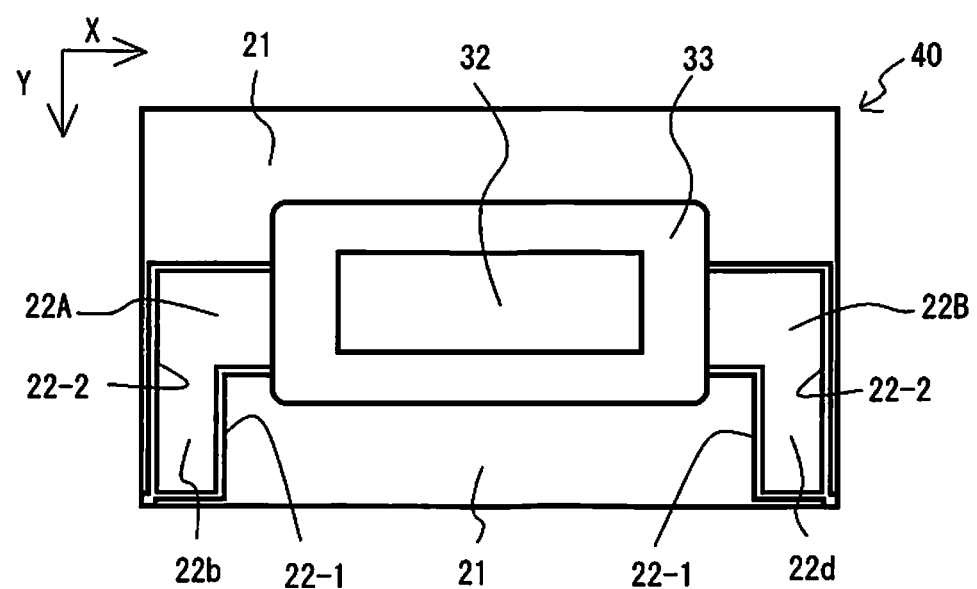
FIG. 9 is a schematic plan views of the light emitting device of another embodiment.

As shown in FIG. 9, the light emitting device 40 in Embodiment 5 includes the element mounting board 20, four light emitting elements 31, and the light reflecting component 33. The light reflecting component 33 integrally covers lateral surfaces of the light emitting elements 31 and the light-transmissive component 32 disposed on the upper surfaces of the light emitting elements 31, and exposes the external connection areas 22b and 22d. The outer edge of the light reflecting component 33 on the external connection area 22b and 22d side is disposed at a location that is in contact with the outer edges of the second conductive layer 22-2.

This light emitting device 40 is configured substantially the same as the light emitting device 30 in Embodiment 4, except that four of the light emitting elements 31 are mounted, and that in the conductive patterns 22A and 22B the external connection areas 22b and 22d extend from the element mounting areas 22a in a direction that is the same as the direction X in which the element mounting areas 22a and 22c are arranged, and are disposed on different sides of the base 21.

Embodiment 6: Light Emitting Device

Figure 10:
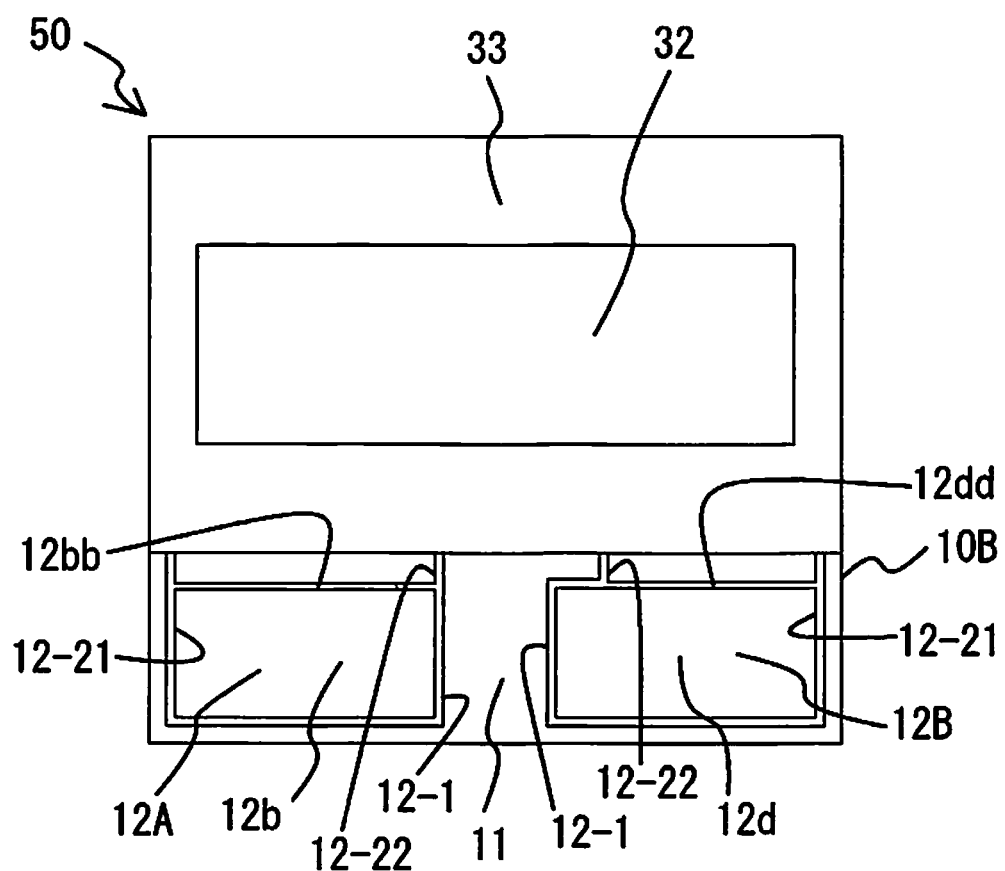
FIG. 10 is a schematic plan views embodiment of the light emitting device according to another embodiment.

As shown in FIG. 10, the light emitting device 50 in Embodiment 6 is configured substantially the same as the light emitting device 30 in Embodiment 4, except that the element mounting board 10B is used.

This light emitting device 50 is configured such that in the external connection areas 12b and 12d, the second conductive layers are divided by slits 12bb and 12dd into second conductive layers 12-21 and 12-22, and the first conductive layer 12-1 is exposed between the two second conductive layers 12-21 and 12-22.

Also, in plan view, part of the outer edge of the light reflecting component 33 is disposed on the second conductive layer 12-22 divided by the slits 12bb and 12dd. The light reflecting component 33 is away from the other second conductive layer 12-21 divided by the slits 12bb and 12dd.

Because in the external connection areas the second conductive layers are divided using the slits 12bb and 12dd as boundaries, and the light reflecting component 33 is away from one second conductive layer and disposed on the other second conductive layer, the resin component is less likely to spread out on the second conductive layers that are away from the light reflecting component during formation of the light reflecting component 33. Consequently, poor bonding between the second conductive layers and the electrical power supply and other such problems can be effectively reduced.

The light emitting device of the present disclosure can be used for light sources of various applications, for example, lighting fixtures, various types of indicators, interior and exterior of lighting for vehicles, display, backlight of liquid crystal displays, signal devices, and channel letter for signage.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A light emitting device comprising:
   an element mounting board including a base;
   a first and second conductive patterns that are disposed on a main surface of the base and each include one or more element mounting areas and one or more external connection areas;
   one or more light emitting elements that are mounted on the element mounting areas and each have an upper surface serving as a light extraction surface;
   a light-transmissive component that is disposed on the upper surfaces of the light emitting elements; and
   a light reflecting component that integrally covers the element mounting areas and lateral surfaces of the light emitting elements and the light-transmissive component while exposing the external connection area,
   wherein each of the first and second conductive patterns includes a first conductive layer and a second conductive layer that is made of a different material from a material of the first conductive layer and is disposed after the first conductive layer,
   wherein the element mounting areas include the first conductive layer that is not covered by the second conductive layer, and the external connection areas include the first conductive layer of which an outer edge is exposed from the second conductive layer, and
   wherein at least a part of an outer edge of the light reflecting component is disposed between the element mounting area and the external connection area.

2. The light emitting device according to claim 1, wherein the base has a substantially quadrangular shape, and the external connection areas of each of the first and second conductive patterns extend from an outer edge of the light reflecting component toward a same side of the quadrangular shape of the base.

3. The light emitting device according to claim 1, wherein an outermost surface of the first conductive layer is formed of a layer that contains gold.

4. The light emitting device according to claim 1, wherein an outermost surface of the second conductive layer is formed of a layer that contains copper or aluminum.

5. The light emitting device according to claim 1, wherein the second conductive layer on the external connection area has a slit or a groove.

6. The light emitting device according to claim 1, wherein the light emitting element are mounted on the element mounting board via a bonding component containing gold.

7. The light emitting device according to claim 1, wherein one of the first and second conductive patterns has a narrower part in the external connection area.

8. The light emitting device according to claim 4, wherein the first conductive layer has a thickness in a range of 1.0 µm to 10.0 µm.

9. The light emitting device according to claim 5, wherein the second conductive layer has a thickness in a range of 2.0 µm to 10.0 µm.

10. The light emitting device according to claim 1, wherein
the light-transmissive component contains a phosphor.

11. The light emitting device according to claim 1, further comprising
a third conductive pattern disposed between the first and second conductive patterns.

12. An element mounting board comprising:
   a base; and
   conductive patterns that are disposed on a main surface of the base,
   wherein each of the conductive patterns has a part that is covered by a light reflecting component,
   the conductive patterns each include one or more element mounting areas that are covered by the light reflecting component, and external connection areas that extend from the element mounting area and are exposed from the light reflecting component,
   the conductive patterns each include a first conductive layer and a second conductive layer that is made of a different material from a material of the first conductive layer,
   the first conductive layer and the second conductive layer are disposed in this order from the base side,
   the element mounting areas include the first conductive layer that is not covered by the second conductive layer,
   the external connection areas include the first conductive layer in which an outer edge is exposed from the second conductive layer, and
   at least a part of an outer edge of the light reflecting component is disposed between the element mounting area and the external connection area.

13. The element mounting board according to claim 12, wherein
an outermost surface of the first conductive layer is formed of a layer that contains gold.

14. The element mounting board according to claim 12, wherein
an outermost surface of the second conductive layer is formed of a layer that contains copper or aluminum.

* * * * *